United States Patent [19]

Funatsu

[11] 4,225,958

[45] Sep. 30, 1980

[54] DEVICE COMPRISING CIRCUITS FOR HOLDING, IN PARTICULAR, A TEST DATA SIGNAL

[75] Inventor: Shigehiro Funatsu, Tokyo, Japan

[73] Assignee: VLSI Technology Research Association, Kawasaki, Japan

[21] Appl. No.: 20,136

[22] Filed: Mar. 13, 1979

[30] Foreign Application Priority Data

Mar. 13, 1978 [JP] Japan ................................ 53-28972

[51] Int. Cl.³ ...................... G01R 31/28; G06F 11/00

[52] U.S. Cl. .................................. 371/15; 324/73 R

[58] Field of Search ........ 235/302; 324/73 R, 73 AT; 364/200, 900; 371/15, 24, 25

[56] References Cited

U.S. PATENT DOCUMENTS

| | | | |
|---|---|---|---|
| 3,761,695 | 9/1973 | Eichelberger | 235/302 |
| 3,789,205 | 1/1974 | James | 235/302 |
| 3,961,254 | 6/1976 | Cavaliere et al. | 324/73 AT |
| 4,038,648 | 7/1977 | Chesley | 324/73 R |
| 4,063,080 | 12/1977 | Eichelberger et al. | 235/302 |
| 4,074,851 | 2/1978 | Eichelberger et al. | 235/302 |

OTHER PUBLICATIONS

Tsui, Arrangement for Minimized Functional Test of LSI Logic Chips, IBM Technical Disclosure Bulletin, vol. 15, No. 9, Feb. 1973, pp. 2870–2872.

Goel and Hsieh, Testing of Random Logic, IBM Technical Disclosure Bulletin, vol. 16, No. 2, Jul. 1973, pp. 429–430.

Leininger, On-Chip Testing Enhancement of a Single-Chip Microprocessor, IBM Technical Disclosure Bulletin, vol. 21, No. 1, Jun. 1978, pp. 5–6.

*Primary Examiner*—Charles E. Atkinson

*Attorney, Agent, or Firm*—Sughrue, Rothwell, Mion, Zinn and Macpeak

[57] ABSTRACT

An electronic device, such as an LSI, comprising a logic circuit and an electronic circuit that comprises, in turn, a large-capacity memory circuit and/or at least one oscillator is provided with a holding circuit between the logic and the electronic circuits and between the electronic circuit and a device output terminal. The holding circuit merely delivers output signals of the logic circuit to the electronic circuit and feeds back output signals of the electronic circuit to the logic circuit in normal operation of the device. During test of the logic and the electronic circuits, the holding circuit selects and holds a test signal of a preselected time-sequential pattern and is switched to select the logic circuit output signals, which are produced by the device with a prescribed combination of logic levels when the device has no defects. Similarly, a holding circuit output signal is given a predetermined time-sequential pattern. Preferably, the holding circuit comprises first and second holding circuits equal in number to inputs and outputs, respectively, of the electronic circuit to serve as mere data buses and a shift register in the normal and the test modes of operation, respectively.

6 Claims, 3 Drawing Figures

DEVICE COMPRISING CIRCUITS FOR HOLDING, IN PARTICULAR, A TEST DATA SIGNAL

BACKGROUND OF THE INVENTION

This invention relates to an electronic device, such as a large-scale integrated circuit, comprising a considerably complicated logic circuit and/or the like.

Logic circuits are functionally classified into a combinational and a sequential circuit in the art. A combinational circuit comprises an AND gate, an OR gate, and/or a similar circuit. A sequential circuit comprises a register, a flip-flop circuit or a memory cell, and/or a like circuit. Test of a combinational circuit is comparatively easy. Test of a sequential circuit is somewhat difficult. For the test of a sequential circuit, a proposal has been made according to which all circuit components, such as registers, are cascade-connected into a shift register. A test data signal of a predetermined time-sequential pattern is supplied to the re-connected circuit components to derive an output signal for the test. This proposal is not effective when the logic circuit comprises a great number of memory cells or the like because it is too troublesome and adversely affects the test efficiency to re-connect the registers and the like into a single shift register. Moreover, the test is very difficult when an electronic device including a logic circuit comprises at least one oscillator. This is because it is difficult to freely control the oscillator from a peripheral circuit, such as a testing installation. In order to facilitate description of the instant invention, a considerable number of memory cells and/or like circuits and/or at least one oscillator will be called an electronic circuit throughout the specification.

SUMMARY OF THE INVENTION

It is therefore an object of the present invention to provide an electronic device that is readily tested even when the device comprises a considerable number of registers and/or memory cells.

It is another object of this invention to provide an electronic device of the type described, which may comprise at least one oscillator.

It is still another object of this invention to provide an electronic device of the type described, which comprises an additional circuit that simplifies the test but does not adversely affects the normal operation and the costs of manufacture and operation.

It is a further object of this invention to provide a holding circuit which serves merely as a data bus in a normal mode and is operable in combination with similar holding circuits as a shift register in a test mode.

According to this invention, there is provided an electronic device operable in either of a normal and a test mode and comprising a first input terminal for receiving a first data signal in whichever of the normal and the test modes, a second input terminal for receiving a second data signal in the test mode, an output terminal, a logic circuit for receiving the first and the second data signals from the first and the second input terminals, respectively, an electronic circuit, and holding means between the logic and the electronic circuits and between the electronic circuit and the output terminal. The holding means is responsive in the normal mode to the first data signal for supplying a third data signal to the output terminal in cooperation with the logic and the electronic circuits and for selectively holding the first and the second data signals in the test mode to supply a fourth data signal to the output terminal in cooperation with the logic and the electronic circuits.

According to this invention, there is also provided a holding circuit operable in either of a normal and a test mode and responsive to a first data input signal in whichever of the normal and the test modes, a second data input signal in the test mode, a first control signal having a first level in the normal mode and either of the first and a second level in the test mode, and a second control signal having a third and a fourth level in the normal and the test modes, respectively. The holding circuit comprises first means responsive to the first and the second data input signals and the first control signal for selecting the first and the second data input signals to produce a first selected signal when the first control signal has the first and the second levels, respectively, and second means responsive to the first selected and the second control signals for producing the first selected signal as a second selected signal and for holding the second selected signal to produce a third selected signal when the second control signal has the third and the fourth levels, respectively.

DESCRIPTION OF THE PREFERRED EMBODIMENTS

Figure 1:
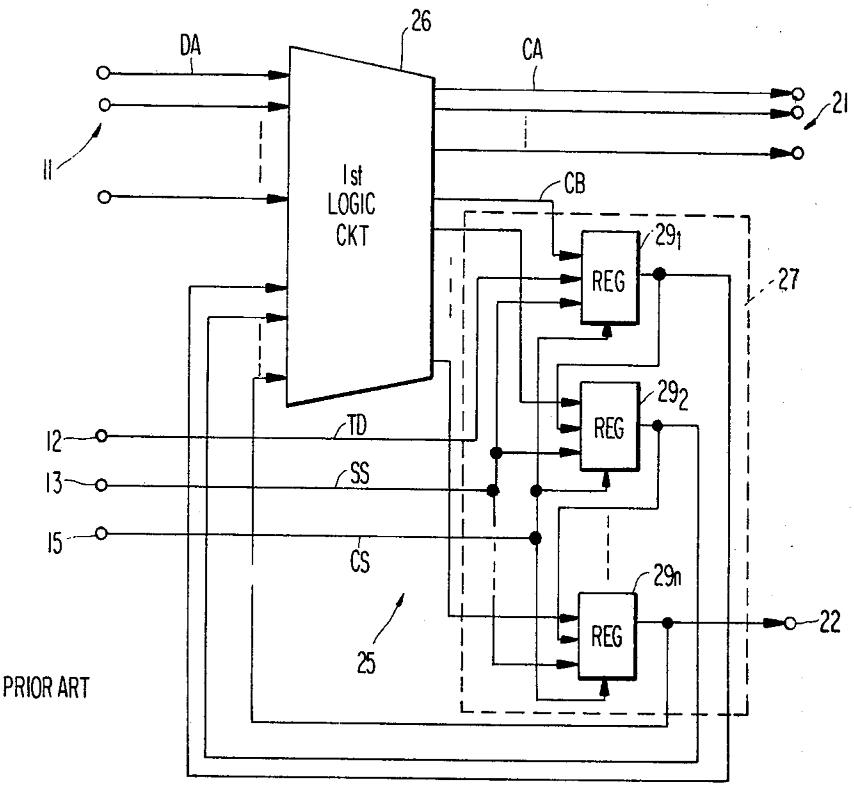
FIG. 1 is a block diagram of a conventional electronic device operable in a normal and a test mode.

Referring to FIG. 1, a conventional electronic device operable in either of a normal and a test mode will be described at first in order to facilitate an understanding of the present invention. In the test mode, the device is put into operation by a testing installation (not shown). The device has a set of first input terminals 11 for receiving a set of input or first data signals DA in whichever of the normal and the test modes, a second input terminal 12 for receiving a test or second data signal TD in the test mode, a third input terminal 13 for a selection control signal SS, a clock input terminal 15 for a controllable sequence of clock pulses CS, a set of first output terminals 21, and a second output terminal 22. The input data signals DA are possessed of various combinations of logic "1" and "0" levels. The test data signal TD has a time-sequential pattern of the logic "1" and "0" levels or bits. The selection control signal SS has a first level in the normal mode and either of the first level and a second level in the test mode. Merely for brevity of the description, the first and the second levels are restricted to the logic "1" and "0" levels, respectively, throughout the following description. The clock pulse sequence CS is for use in both of the normal and the test modes to time the data and the control signals and is controllable in the test mode.

The device illustrated in FIG. 1 comprises a logic circuit 25 comprising, in turn, first and second logic circuits 26 and 27, which are a combinational and a sequential circuit, respectively. In the normal mode, the first logic circuit 26 is primarily responsive to the input data signals DA for supplying the first output terminals 21 with a set of first output data signals CA that depend only on each combination of the logic level or levels of the input data signals DA at a time. The second logic circuit 27 comprises first through n-th registers $29_1$, $29_2$, . . . , and $29_n$. In the normal mode, the registers 29 (suffix omitted) are connected in parallel and responsive to a set of intermediary input signals CB supplied from the first logic circuit 26 and the clock pulse sequence CS to simultaneously feed the first logic circuit 26 with intermediary output signals that depend on each combination of the logic level or levels had by the input data signals DA a clock period before. Depending on the intermediary output signals, the first output data signals CA are modified according to the input data signals DA.

The test data signal TD shown in FIG. 1 is for use in testing the device and supplied only to the first register $29_1$. It should be recollected that the selection control signal SS is given in the test mode the logic "1" and "0" levels, when the registers 29 are connected in parallel and series for the test data signal TD, respectively. According as the registers 29 are connected in parallel and series, each register 29 selects one of the intermediary input signals CB supplied thereto from the first logic circuit 26 and the test data signal TD supplied thereto from a next preceding one, if any, of the registers 29, respectively. The registers 29 thus produce test output signals. One of the test output signals that is produced by the last or n-th register $29_n$ is supplied to the second output terminal 22 as a second output data signal. It is usual that the selection control signal SS is given the logic "0" level at least for a duration of n clock periods so that the registers 29 may serve as an n-stage shift register with the clock pulse sequence CS used as a shift pulse sequence.

More particularly referring to FIG. 1, test of the device is carried out as follows. At first, the selection control signal SS is given the logic "0" level for n clock periods with the test data signal TD given a predetermined pattern of the logic "1" and "0" levels.

The pattern is set in the registers 29. The clock pulses of the sequence CS are suspended. The selection control signal SS is given the logic "138 level. The input data signals DA are given a predetermined combination of the logic "1" and "0" levels. The first output data signals CA are given a particular combination of the logic "1" and "0" levels that is decided by the structure of the first logic circuit 26 and the predetermined pattern of the test data signal TD. Likewise, the intermediary input signals CB are given a prescribed combination of the logic "1" and "0" levels that may or may not differ from the predetermined combination. The selection control signal SS is switched to the logic "1" level. A clock pulse of the sequence CS is supplied to the clock input terminal 15, when the logic levels of the prescribed combination are simultaneously set in the registers 29. When the selection control signal SS is given the logic "0" level for n clock periods, the second output signal is successively given the prescribed pattern. It is therefore possible by observing the first and the second output data signals to test the logic circuits 26 and 27. The test is, however, inconvenient as pointed out in the preamble of the instant specification particularly when the device comprises an electronic circuit as will presently be described.

Figure 2:
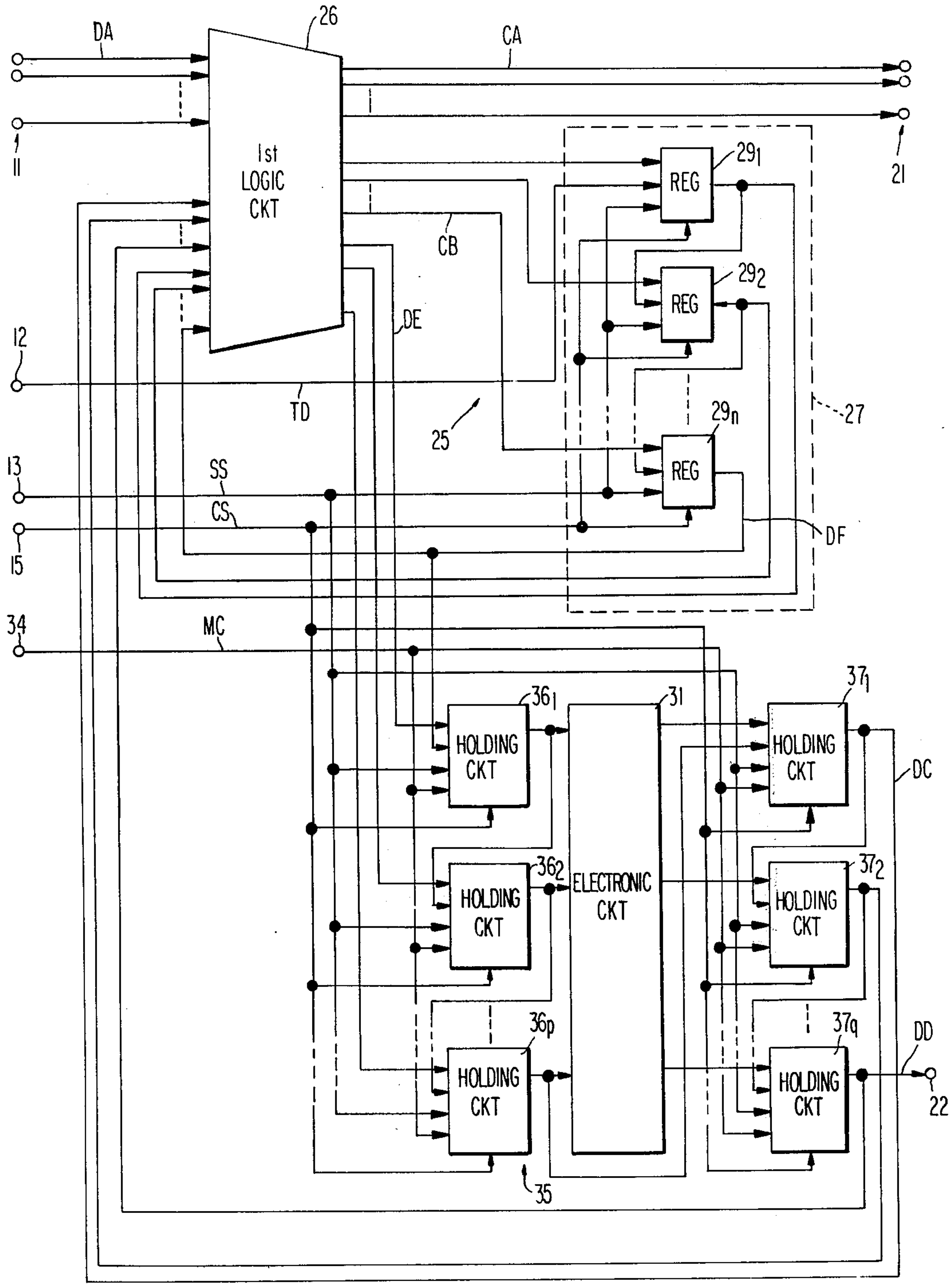
FIG. 2 is a block diagram of an electronic device according to a preferred embodiment of this invention.

Referring now to FIG. 2, an electronic device according to an embodiment of this invention comprises similar parts designated by like reference numerals and is operable with similar signals indicated by like reference letters. The device comprises an electronic circuit 31 in combination with the logic circuit 25. A fourth input terminal 34 is for a mode control signal MC that is given a third and a fourth level in the normal and the test modes, respectively, in synchronism with the clock pulse sequence CS. As will later become clear, it is possible to understand that the mode control signal MC specifies one and the other of the normal and the test modes by the level thereof. The third and the fourth levels will be referred to in the following as the logic "1" and "0" levels, respectively, again for brevity of the description.

The device shown in FIG. 2 comprises a holding circuit 35 comprising, in turn, a first predetermined number of first holding circuits $36_1$, $36_2$, . . . , and $36_p$ and a second predetermined number of second holding circuits $37_1$, $37_2$, . . . , and $37_q$ between the logic and the electronic circuits 25 and 31 and between the electronic circuit 31 and the second output terminal 22, respectively. When the electronic circuit 31 is a memory circuit, the first and the second predetermined numbers are rendered equal to the number of address signal bits, such as 16, and the number of bits, such as 32, memorized in each of $2^{16}$ addresses. For a voltage-controlled oscillator, these numbers are equal to each other and to the number of levels of a frequency control input signal or of the controlled frequencies of an output signal. Responsive to the input data signals DA supplied through the logic circuit 25, the holding circuit 35 supplies in the normal mode a third data signal DC to the second output terminal 22 in cooperation with the logic and the electronic circuits 25 and 31. In the test mode, the holding circuit 35 selects the input data signals DA or the test data signal TD supplied thereto also through the logic circuit 25 and holds the selected signal or signals to supply a fourth data signal DD to the second output terminal 22 again in cooperation with the logic and the electronic circuits 25 and 31.

In the device thus far described in conjunction with FIG. 2, the circuit 35 does not hold the input data signal DA in the normal mode although called a holding circuit. The circuit 35 thus serves merely as a data bus between the logic and the electronic circuits 25 and 31 and between the electronic circuit 31 and the second output terminal 22. In the test mode, the holding circuit 35 holds the test data signal TD. Furthermore, the holding circuit 35 is selectively operable to hold the input data signal DA. The holding circuit 35 thus acts as a single shift register together with the registers 29, if any. Inasmuch as the device of the type described is usually supplied as a large-scale integrated circuit, the holding circuit 35 or circuits 36 and 37 do not raise the costs of manufacture and operation but allow the test to be readily carried out.

In a more preferred embodiment shown in FIG. 2 of this invention, the first logic circuit 26 produces fifth data signal DE in the normal mode in response to the input data signal DA and the third data signal DC fed back thereto. The fifth data signals DE are modified by the intermediary output signals and the third data signals DC. In the test mode, the logic circuit 25 produces a sixth data signal DF through the second logic circuit 27 in response to the input and the test data signals DA and TD and to the third and the fourth data signals DC and DD fed back to the first logic circuit 26. Supplied with an input signal set, such as a set of address signals, the electronic circuit 31 produces a set of output signals that may represent the addressed data. As is the case with the registers 29, the first and the second holding circuits 36 and 37 (suffix omitted) are connected in parallel and series in each group in the normal and the test modes, respectively. In FIG. 2, the first holding circuits 36 now produce in response in the normal mode to the fifth data signals DE first data output signals, which are supplied to the electronic circuit 31 as the input signals thereof. In the test mode, the first holding circuits 36 select the fifth data signals DE or the sixth data signals DF supplied from the successively preceding stages, if any, and hold the selected signals to produce a second data output signal, which is supplied only to the first stage $37_1$. Responsive in the normal mode to the electronic circuit output signals, the second holding circuits 37 produce third data output signals. One of the third data output signals that is produced by the last-stage second holding circuit $37_q$ is supplied to the second output terminal 22 as a relevant one of the third data signals DC. In the test mode, the second holding circuits 37 select the electronic circuit output signals or the second data output signals and hold the selected signals to produce a fourth data output signal, which is supplied to the second output terminal 22 as the fourth data signal DD.

Figure 3:
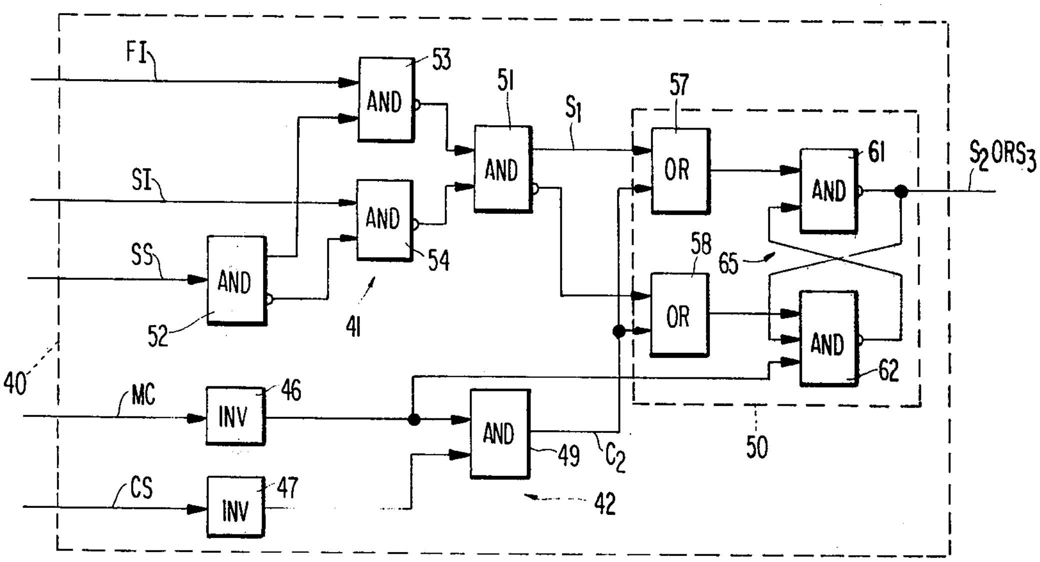
FIG. 3 is a block diagram of an elementary circuit used as a holding circuit in the device illustrated in FIG. 2.

Turning to FIG. 3, an elementary circuit 40 used as each of the first and the second holding circuits 36 and 37 preferably comprises first and second circuits 41 and 42. Responsive to first and second data input signals FI and SI, to be described later, and to the selection control signal SS, the first circuit 41 selects the first and the second data input signals FI and SI to produce a first selected signal $S_1$ when the selection control signal SS is of the logic "1" and "0" levels, respectively. Responsive to the first selected signal $S_1$ and the mode control signal MC, the second circuit 42 produces the first selected signal $S_1$ as a second selected signal $S_2$ and holds the first selected signal $S_1$ to produce a third selected signal $S_3$ when the mode control signal MC is given the logic "1" and "0" levels, respectively. When the elementary circuit 40 is used as one of the first holding circuits 36, the fifth and the sixth data signals DE and DF are supplied thereto as the first and the second data input signals FI and SI, respectively, with the second and the third selected signals $S_2$ and $S_3$ produced thereby delivered to the electronic circuit 31 as the input signals thereof. For use as one of the second holding circuits 37, the electronic circuit output and the second data output signals are delivered to the elementary circuit 40 as the first and the second data input signals FI and SI, respectively, and the second and the third selected signals $S_2$ and $S_3$, to the second output terminal 22 as the third and the fourth data signals DC and DD, respectively.

As depicted in FIG. 3, a preferred example of the second circuit 42 comprises a third circuit, such as a first inverter 46, responsive to the mode control signal MC for producing a first intermediary control signal $C_1$ having a fifth and a sixth level when the mode control signal MC has the logic "1" and "0" levels, namely, in the normal and the test modes, respectively. In the illustrated example, the fifth and the sixth levels are the logic "0" and "1" levels. A fourth circuit, such as a group of a second inverter 47 and a first AND gate 49, is responsive to the intermediary control signal $C_1$ and the clock pulse sequence CS to produce a second intermediary control signal $C_2$ possessed of a predetermined level, such as the logic "0" level, in each of two cases where the first intermediary control signal $C_1$ is given the logic "0" level and where the clock pulses of the sequence CS are supplied thereto during the time that the first intermediary control signal $C_1$ is given the logic "1" level. In the illustrated group of the elements 47 and 49, the AND gate 49 is disabled in the normal mode to give the logic "0" level to the second intermediary control signal $C_2$. The AND gate 49 is enabled in the test mode to give the logic "0" and "1" levels in the presence and absence, respectively, of the clock pulses of the sequence CS. The circuit 42 further comprises a circuit element 50 responsive to the first selected signal $S_1$ and the first and the second intermediary control signals $C_1$ and $C_2$ for producing the second selected signal $S_2$ in a case where the first intermediary control signal $C_1$ has the logic "0" level and furthermore where the second intermediary control signal $C_2$ has the logic "0" level. The circuit element 50 holds the first selected signal $S_1$ to produce the third selected signal $S_3$ when the second intermediary control signal $C_2$ has the logic "0" level during the time that the first intermediary control signal $C_1$ has the logic "1" level.

Referring more specifically to FIG. 3, the first circuit 41 more preferably comprises a first and a second AND gate 51 and 52 and a first and a second NAND gate 53 and 54. Supplied with the selection control signal SS, the second AND gate 52 delivers the selection control signal SS to the first and the second AND gates 53 and 54 directly and through an inverter, respectively. The first and the second NAND gates 53 and 54 are thus selectively enabled in whichever of the normal and the test modes to deliver the first and the second data input signals FI and SI to the first AND gate 51 as the first selected signal when the selection control signal SS has the logic "1" and "0" levels. In the example being illustrated, the circuit element 50 comprises first and second OR gates 57 and 58 to which the first selected signal is delivered directly and through an inverter, respectively, and to both of which the second intermediary control signal $C_2$ is supplied. Third and fourth NAND gates 61 and 62 having two and three inputs, respectively, are connected to each other to form a latch circuit 65 and to the first and the second OR gates 57 and 58, respectively. The first intermediary control signal $C_1$ is supplied to the fourth NAND gate 62, which delivers a logic "1" signal to the third NAND gate 61 in the normal mode when the first intermediary control signal $C_1$ has the logic "0" level. The third NAND gate 61 produces the first selected signal $S_1$ as the second selected signal $S_2$ with the level inverted. It should be noted here that the first selected signal $S_1$ is not held by the latch circuit 65 under the circumstances. In the test mode when the first intermediary control signal $C_1$ takes the logic "1" level, the second intermediary control signal $C_2$ is given the logic "0" level when the clock pulses of the sequence CS are supplied to the second inverter 47. The latch circuit 65 holds the first selected signal $S_1$ until a next following pulse appears in the clock pulse sequence CS and produces the third selected signal $S_3$.

Referring back to FIG. 2, it will now readily be appreciated from the description of FIG. 1 that the test data signal TD for use with an electronic device according to the preferred embodiment of this invention is given a predetermined time sequential pattern or a repetition of prescribed shorter-period patterns in a total period of at least n+p+q clock periods. In the test mode, the selection control signal SS is given the second level at first for at least n+p+q clock periods and then switched to the first level with the clock pulses suspended. In the normal mode, the first and the second holding circuits 36 and 37 serve merely as a first data bus between the logic and the electronic circuits 25 and 31 and a second data bus between the electronic circuit 31 and the second output terminal 22, respectively.

In the test mode, the holding circuits 36 and 37 are connected, together with the registers 29, as a single shift register for the test pattern of the signal TD. When the logic and the electronic circuits 25 and 31 have no defects, the first output signals CA are given a particular combination of the logic "1" and "0" levels that is decided by the structure of the logic and the electronic circuits 25 and 31, the combination of the logic "1" and "0" levels that is given to the input data signal DA after the test pattern is set in the shift register, and the pattern given to the test data signal TD. The intermediary input signals CB, the fifth data signals DE, and the electronic output signals are also given a prescribed combination of the logic "1" and "0" levels that differs in general from the predetermined combination. When a next following sequence CS of n+p+q clock pulses is supplied to the clock input terminal 34, the fourth data signal DD is produced with a preselected time-sequential pattern that is determined again by the structure of the logic and the electronic circuits 25 and 31 and the combination and the pattern given to the input and the test data signals DA and TD, respectively. It is therefore possible to detect a defect, if any, in at least the logic circuit 25 by observing the signals at the first and/or the second output terminal 21 and 22 in the test mode.

While a few embodiments of this invention have so far been described, it is readily possible for those skilled in the art to modify the illustrated embodiments in various manners. For example, this invention is applicable to an electronic device comprising any one of a first logic circuit 26 and a second logic circuit 27 in combination with an electric circuit 31. It is also possible to test the logic circuit 25 in the above-described manner and thereafter test the electronic circuit 31 in a conventional manner by supplying thereto a set of input signals either directly or through the first holding circuits 36 and observing the output signal set either directly or through the second holding circuits 37. It is readily understood that the third data signal DC supplied to the second output terminal 22 is out of care in the normal mode.

What is claimed is:

1. An electronic device operable in either of a normal and a test mode and comprising a first input terminal for receiving a first data signal in whichever of said normal and said test modes, a second input terminal for receiving a second data signal in said test mode, an output terminal, a logic circuit for receiving said first and said second data signals from said first and said second input terminals, respectively, an electronic circuit, and holding means between said logic and said electronic circuits and between said electronic circuit and said output terminal, said holding means being responsive in said normal mode to said first data signal for supplying a third data signal to said output terminal in cooperation with said logic and said electronic circuits and for selectively holding said first and said second data signals only in said test mode to supply a fourth data signal to said output terminal in cooperation with said logic and said electronic circuits.

2. An electronic device as claimed in claim 1, said logic circuit being responsive to said first data signal and said third data signal fed back thereto in said normal mode and to said first and said second data signals and said third and said fourth data signals fed back thereto in said test mode for producing a fifth and a sixth data signal, respectively, said electronic circuit being responsive to an electronic circuit input signal for producing an electronic circuit output signal, wherein:

said holding means comprises first and second supply means connected to said electronic circuit and said output terminal, respectively, and first and second holding means between said logic circuit and said first supply means and between said electronic circuit and said second supply means, respectively;

said first holding means being for producing only in said normal mode a first data output signal in response to said fifth data signal and for selectively holding said fifth and said sixth data signals only in said test mode to produce a second data output signal;

said first supply means being for supplying said first and said second data output signals to said electronic circuit as said electronic circuit input signal;

said second holding means being for producing only in said normal mode a third data output signal in response to said electronic circuit output signal and for selectively holding said electronic circuit output and said second data output signals only in said test mode to produce a fourth data output signal;

said second supply means being for supplying said third and said fourth data output signals to said output terminal as said third and said fourth data signals, respectively.

3. An electronic device as claimed in claim 2, further comprising a third input terminal for receiving a first control signal having a first level in said normal mode and either of said first level and a second level in said test mode and a fourth input terminal for receiving a second control signal having a third and a fourth level in said normal and said test modes, respectively, wherein:

each of said first and said second holding means comprises first means responsive to a first and a second data input signal and said first control signal for selecting said first and said second data input signals to produce a first selected signal when said first control signal has said first and said second levels, respectively, and second means responsive to said first selected and said second control signals for producing said first selected signal as a second selected signal and for holding said first selected signal to produce a third selected signal when said second control signal has said third and said fourth levels, respectively;

said first holding means comprising means for supplying said fifth and said sixth data signals to the first means thereof as said first and said second data input signals, respectively, and means for supplying the second and the third selected signals produced by the second means thereof to said first supply means as said first and said second data output signals, respectively;

said second holding means comprising means for supplying said electronic circuit output and said second data output signals to the first means thereof as said first and said second data input signals, respectively, and means for supplying the second and the third selected signals produced by the second means thereof to said second supply means as said third and said fourth data output signals, respectively.

4. An electronic device as claimed in claim 3, further comprising a fifth input terminal for receiving a controllable sequence of clock pulses that are produced in said normal mode and when said first control signal is given said second level in said test mode and that are suspended when said first control signal is given said first level in said test mode, wherein the second means of each of said first and said second holding means comprises:

third means responsive to said second control signal for producing a third control signal having a fifth and a sixth level when said second control signal has said fourth and said third levels, respectively;

fourth means responsive to said third control signal and said clock pulse sequence for producing a fourth control signal possessed of a predetermined level in each of two cases where said third control signal has said sixth level and where said clock pulses are supplied thereto during the time that said third control signal has said fifth level; and fifth means responsive to said first selected signal and said third and said fourth control signals for producing said second selected signal when a clock pulse of said sequence is supplied to said fifth input terminal after said clock pulses are suspended and for holding said first selected signal to produce said third selected signal in a case where said third control signal has said sixth level and furthermore where said fourth control signal has said predetermined level and in another case where said fourth control signal has said predetermined level during the time that said third control signal has said fifth level, respectively.

5. A holding circuit operable in either of a normal and a test mode and responsive to a first data input signal in whichever of said normal and said test modes, a second data input signal in said test mode, a first control signal having a first level in said normal mode and either of said first level and a second level in said test mode, and a second control signal having a third and a fourth level in said normal and said test modes, respectively, which comprises:

first means responsive to said first and said second data input signals and said first control signal for selecting said first and said second data input signals to produce a first selected signal when said first control signal has said first and said second levels, respectively; and second means responsive to said first selected and said second control signals for producing said first selected signal as a second selected signal and for holding said second selected signal to produce a third selected signal when said second control signal has said third and said fourth levels, respectively.

6. A holding circuit as claimed in claim 5, further responsive to a controllable sequence of clock pulses that are produced in said normal mode and when said first control signal is given said second level in said test mode and that are suspended when said first control signal is given said first level in said test mode, wherein said second means comprises:

third means responsive to said second control signal for producing a third control signal having a fifth and a sixth level when said second control signal has fourth and said third levels, respectively;

fourth means responsive to said third control signal and said clock pulse sequence for producing a fourth control signal possessed of a predetermined level in each of two cases where said third control signal has said sixth level and where said clock pulses are supplied thereto during the time that said third control signal has said fifth level; and fifth means responsive to said first selected signal and said third and said fourth control signals for producing said second selected signal when a clock pulse of said sequence is supplied after said clock pulses are suspended and for holding said first selected signal to produce said third selected signal in a case where said third control signal has said sixth level and furthermore where said fourth control signal has said predetermined level and in another case where said fourth control signal has said predetermined level during the time that said third control signal has said fifth level, respectively.

* * * * *

UNITED STATES PATENT AND TRADEMARK OFFICE
CERTIFICATE OF CORRECTION

PATENT NO. : 4,225,958

DATED : September 30, 1980

INVENTOR(S) : Shigehiro FUNATSU

It is certified that error appears in the above—identified patent and that said Letters Patent is hereby corrected as shown below:

Column 3, line 44, delete'"138' and insert -- "1" -- .

Column 6, line 29, delete "AND" and insert -- NAND -- .

Column 7, line 40, delete "electric" and insert -- electronic -- .

Signed and Sealed this

*Seventeenth* Day of *March 1981*

[SEAL]

*Attest:*

RENE D. TEGTMEYER

*Attesting Officer* *Acting Commissioner of Patents and Trademarks*